United States Patent
Szczech et al.

(10) Patent No.: US 8,318,032 B2
(45) Date of Patent: Nov. 27, 2012

(54) METHOD TO PATTERN METALLIZED SUBSTRATES USING A HIGH INTENSITY LIGHT SOURCE

(75) Inventors: John B. Szczech, Schaumburg, IL (US); Daniel R. Gamota, Palatine, IL (US); Tomasz L. Klosowiak, Glenview, IL (US); Jerzy Wielgus, Mount Prospect, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 870 days.

(21) Appl. No.: 11/962,164

(22) Filed: Dec. 21, 2007

(65) Prior Publication Data

US 2009/0159565 A1    Jun. 25, 2009

(51) Int. Cl.
*B44C 1/22* (2006.01)

(52) U.S. Cl. .................... 216/41; 438/800; 257/798

(58) Field of Classification Search ............ 216/41; 438/800; 257/798
See application file for complete search history.

(56) References Cited

U.S. PATENT DOCUMENTS

| | | | |
|---|---|---|---|
| 4,980,020 A | 12/1990 | Douglas | |
| 5,093,279 A | 3/1992 | Andreshak et al. | |
| 5,545,307 A * | 8/1996 | Doss et al. | 205/122 |
| 6,207,553 B1 * | 3/2001 | Buynoski et al. | 438/622 |
| 6,680,578 B2 * | 1/2004 | Antoniadis et al. | 315/169.3 |
| 6,946,410 B2 * | 9/2005 | French et al. | 438/800 |
| 7,037,854 B2 | 5/2006 | Bachrach et al. | |
| 7,056,446 B2 | 6/2006 | Nagase et al. | |
| 7,399,703 B2 | 7/2008 | Kawakami | |
| 7,759,609 B2 * | 7/2010 | Asscher et al. | 219/121.85 |
| 2007/0190326 A1 | 8/2007 | Perry et al. | |

FOREIGN PATENT DOCUMENTS

| | | |
|---|---|---|
| JP | 2004-247203 A | 9/2004 |
| JP | 2005-347378 A | 12/2005 |
| WO | WO2005092043 A2 | 6/2005 |
| WO | WO2006094040 A2 | 9/2006 |

OTHER PUBLICATIONS

S. Wolf et al. Silicon Processing for the VLSI Era vol. 1, (1986) pp. 371-373.*
Sang Keol Kim, "PCT International Search Report and Written Opinion," WIPO, ISA/KR, Korean Intellectual Property Office, Daejeon, Republic of Korea, May 25, 2009. 14 pages.

* cited by examiner

*Primary Examiner* — Nadine Norton
*Assistant Examiner* — Maki Angadi
(74) *Attorney, Agent, or Firm* — Barbara R. Doutre

(57) ABSTRACT

A method for delineating a metallization pattern in a layer of sputtered aluminum or sputtered copper using a broad spectrum high intensity light source. The metal is deposited on a polymeric substrate by sputtering, so that it has a porous nanostructure. An opaque mask that is a positive representation of the desired metallization pattern is then situated over the metallization layer, exposing those portions of the metallization layer intended to be removed. The masked metallization layer is then exposed to a rapid burst of high intensity visible light from an arc source sufficient to cause complete removal of the exposed portions of the metallization layer, exposing the underlying substrate and creating the delineated pattern.

23 Claims, 1 Drawing Sheet

METHOD TO PATTERN METALLIZED SUBSTRATES USING A HIGH INTENSITY LIGHT SOURCE

BACKGROUND

The formation of features in metal layers has been practiced for many years, in, for example, the metal working industry, and in particular, the electronics industry. The formation of electrical circuits on dielectric substrates is of particular interest to the electronics industry, and has seen much activity. This has typically been accomplished either by directly forming a positive likeness of the desired pattern, such as by electroless deposition, or by various forms of etching or removal of material from a metal layer. Wet chemical etching utilizes aggressive chemicals to dissolve unwanted portions of metal, and is the most well known and widely used method of etching. This method has the drawbacks of generating hazardous waste and limited throughput. Dry etching utilizes plasma gases or reactive ion etching to remove the metal, but requires large capital expenditures and is essentially limited to very thin layers of metal. Mechanical methods such as cutting, machining, or drilling are slow and not amenable to very small feature sizes. Lasers have also been used to cut away excess metal, and even to ablate metal away, but, again, are limited in the amount of throughput and have high capital requirements. The most popular method today in the electronics industry is the wet etching method, which uses a patterned mask of photoresist to control where underlying material is etched away and where it is left in place. Such methods provide the required degree of precision for etching semiconductor features with critical dimensions in the submicron range, but typically achieve etch rates in the range of about 1 micron or less of thickness per minute. Where the required features are relatively large scale, in the range of from about 10 to about 100 microns, or where the amount of material to be removed is large, the etch rates achievable by such methods are generally too low to be practical in commercial production. What is needed is a method for removal of metal with high precision, at etch rates exceeding any of the present technologies, that does not generate large amounts of hazardous waste.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1A:
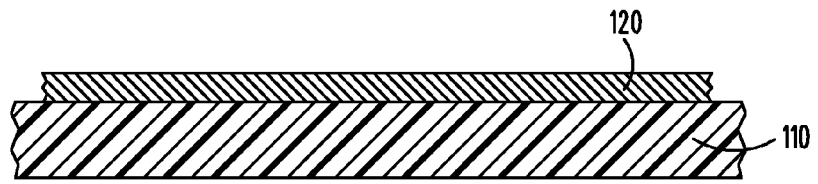
FIGS. 1A-1D are cross-sectional schematic diagrams of a method of delineating a pattern in a metal layer using high intensity light, in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of methods related to delineating a pattern in a metal layer using light. Accordingly, the methods have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

A metallization pattern can be delineated in a layer of sputtered aluminum or sputtered copper using a broad spectrum high intensity light source. The metal is deposited on a polymeric substrate by sputtering, so that it has a porous nanostructure. An opaque mask that is a positive representation of the desired metallization pattern is then situated over the metallization layer, exposing those portions of the metallization layer intended to be removed. The masked metallization layer is then exposed to a rapid burst of high intensity visible light from an arc source sufficient to cause complete removal of the exposed portions of the metallization layer, exposing the underlying substrate and creating the delineated pattern.

Referring now to FIGS. 1A-1D, a dielectric material serves as a substrate 110 that supports a very thin layer of metal 120 deposited on an upper surface thereof (FIG. 1A). While the drawing figure depicts a cutaway portion of the substrate, it should be obvious that the size of the substrate and/or metal layer is arbitrary and left to the user. The substrate may comprise any of numerous flexible or rigid, non-conductive materials, typically polymers or the equivalent, such as polyesters, polyimides, polyamides, polyamide-imides, polyetherimides, polyacrylates, polysiloxanes, polycarbonates, polyolefins, polymethyl methacrylate, polyvinylidene chloride, fabrics, and paper. The layer of metal 120 is typically deposited on the substrate by any of a number of well known vacuum deposition techniques, such as sputtering or evaporating, for example. Vacuum deposited metal layers are very thin, typically less than one (1) micrometer thick, and exhibit a porous structure when viewed at the nano-scale level. We find that both sputtered aluminum and sputtered copper provide films with a porous nanostructure that are quite amenable to use with our invention, but other metals, such as nickel, titanium, and vanadium may also be used. The very thin metal layer 120 consists essentially of sputtered aluminum or sputtered copper, with no appreciable amounts of other metals or other types of metal layers. Of course, normal impurities at trace levels may be present, as is usual in vacuum deposition processes, possibly due to system contamination or impurities in the metal target.

The very thin layer of metal 120 is masked with an optically opaque mask 130 that is a positive representation of the metallization pattern desired to be formed in the layer 120

Figure 1B:
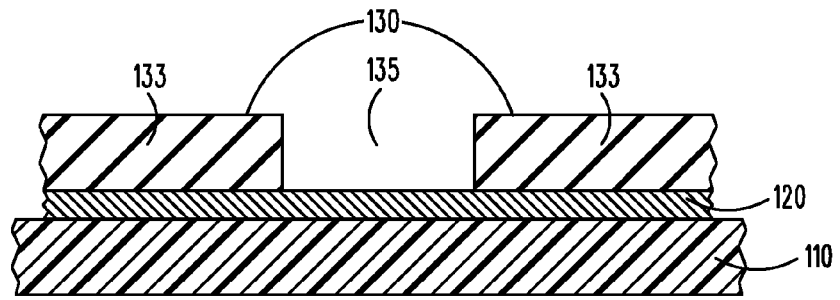
Figure 1C:
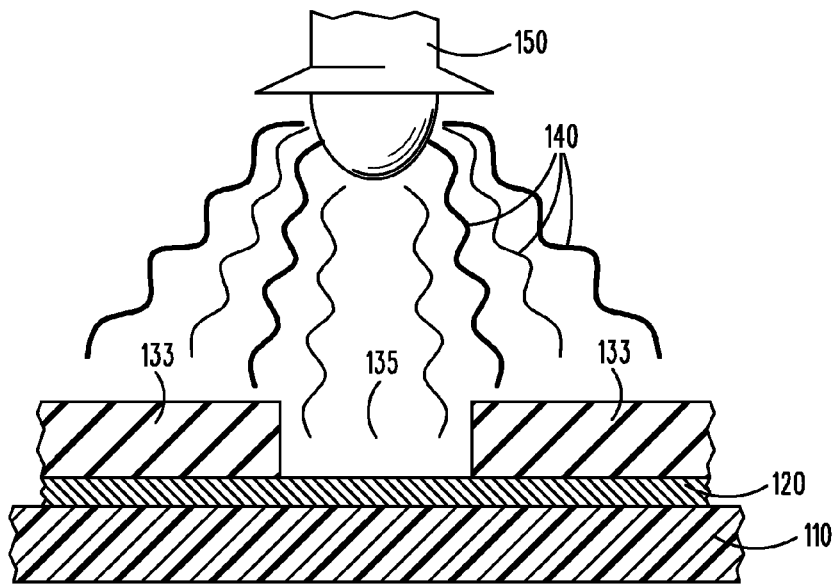
Figure 1D:
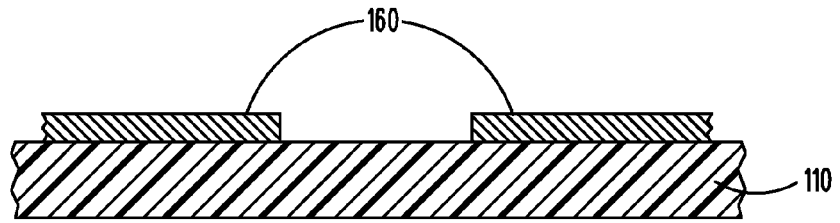

(FIG. 1B). The mask can be, for example, a removable and reusable template or stencil pressed tightly against the metal layer, or non-contact photo mask as is typically used in mask aligners in the semiconductor industry, or it can be chemically or physically deposited directly on the metal layer. An important criteria for the mask 130 is that it clearly mark a boundary, edge, or limit intended to be formed in the metal layer 120, that it be opaque to radiation in the visible, infrared and ultraviolet regions of the electromagnetic spectrum, and that it be heavy or thick relative to the metal layer. The mask 130 contains portions 133 that cover the metal layer 120 and portions 135 that expose the metal layer. Although the drawing figures depict only a single exposed area 135, it should be obvious to those skilled in the art that highly complex patterns containing many (2-10,000) openings can be employed. The masked substrate is then treated (FIG. IC) by subjecting it to a very intense, broad spectrum light 140 for a very short time period. The high intensity light 140 rapidly heats those exposed portions 135 of the sputtered metal layer 120, while the mask prevents the covered portions 133 from being heated. The heating from the pulsed light source 150 is sufficiently intense that the exposed portions 135 of the very thin metal layer 120 are removed by vaporization, ablation, or other thermodynamic processes. One example of a pulsed light source 150 is an arc lamp with a xenon source. This type of source emits a broad spectrum of non-coherent visible light, along with some infrared and ultraviolet light. Although it is unclear as to the magnitude of the role that the ultraviolet and/or infrared light plays in the removal process, it is clear that the broad spectrum of high intensity light (infrared, visible, and/or ultraviolet) causes rapid heating in a localized area, sufficient to completely remove thin layers of sputtered aluminum or copper. The opaque mask 130 is then removed (FIG. 1D) from the substrate containing the delineated metallization pattern 160. The metal is completely removed in those areas that corresponded to the openings 135 in the mask 130, revealing the underlying substrate 110.

Having now described the process for delineating a metallization pattern using a high intensity non-coherent light source, we now present an example.

EXAMPLE 1

Aluminum films sputtered to a thickness of 80-100 nanometers onto a polyester film substrate were appropriately masked and subjected to varying exposures of a pulsed, high intensity xenon arc lamp source. The aluminum films comprised a porous nanostructure that consisted of individual aluminum particles approximately 15-20 nanometers in size. The pulses of light were very short, approximately 300 microseconds, and the supply voltage to the xenon lamp varied from 0 kV to 2.0 kV. At the lowest voltage level, 0kV, there was no detectable removal of the exposed metal. At 1.2kV some of the metal layer had been removed, with larger amounts removed at 1.5kV. Complete removal of the exposed portion of the metal layer was noted at 2.0kV, corresponding to a radiant energy of approximately 1 Joule/cm$^2$. A sharp, patterned edge was formed in the metal in the sample subjected to the 2.0kV lamp.

In summary, our novel method provides for high speed delineation of patterns in sputtered metal layers. We have demonstrated cycle speeds of 50 pulses/second, enabling the flexible polymer film to be fed at speeds up to 1000 ft/min. The metal is quickly and cleanly removed without the use of dangerous and/or toxic chemicals, providing an environmentally friendly method. The conversion efficiency of our method using arc lamps is 10 times greater than systems that utilize lasers to remove metal.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method to pattern metallized substrates, comprising:
   providing a substrate having a metallization layer on a major surface thereof, said layer exhibiting a porous nanostructure;
   situating an opaque mask over selected regions of the metallization layer, the mask being a positive representation of a desired metallization pattern, exposing those portions of the metallization layer intended to be removed;
   exposing the masked metallization layer to a high intensity discharge source sufficient to vaporize the porous nanostructure to cause complete removal of the exposed portions of the metallization layer down to the underlying substrate, wherein the exposed portions of the metallization layer is removed solely by the high intensity discharge source without the use of a chemical substance; and
   removing the opaque mask to reveal a delineated metallization pattern.

2. The method as described in claim 1, wherein the metallization layer comprises sputtered aluminum or sputtered copper.

3. The method as described in claim 2, wherein the metallization layer is less than one micrometer thick.

4. The method as described in claim 2, wherein the metallization layer comprises sputtered aluminum or sputtered copper particles less than 20 nanometers in diameter.

5. The method as described in claim 1, wherein the high intensity discharge source comprises a broad spectrum of ultraviolet, visible, or infrared radiation.

6. The method as described in claim 5, wherein the high intensity discharge source comprises an arc-lamp emitting a pulse of ultraviolet, visible, or infrared spectral radiation.

7. The method as described in claim 6, wherein the high intensity discharge source comprises a 300 microsecond pulse of visible light having a radiant energy greater than 1 Joule/cm$^2$.

8. The method as described in claim 1, wherein the substrate comprises a flexible polymer film.

9. The method as described in claim 1, wherein the delineated metallization pattern consists essentially of an electronic circuit pattern.

10. The method as described in claim 1, wherein situating further comprises pressing the opaque mask directly against the selected regions of the metallization layer.

11. A method for delineating a metallization pattern on substrates, comprising:

providing a substrate having a metallization layer consisting essentially of sputtered aluminum or sputtered copper less than 1 micrometer thick, on a major surface thereof, the metallization layer exhibiting a porous nanostructure;

disposing an opaque mask over selected regions of the metallization layer, the mask being a positive representation of a desired metallization pattern, exposing those portions of the metallization layer intended to be removed;

exposing the masked metallization layer to a rapid burst of high intensity discharge light from an arc-lamp source sufficient to cause vaporization and complete removal of the exposed portions of the metallization layer, exposing the underlying substrate, wherein the exposed portions of the metallization layer is removed solely by the rapid burst of high intensity discharge light without the use of a chemical substance; and removing the opaque mask to reveal the delineated metallization pattern.

12. The method as described in claim 11, wherein the substrate comprises a flexible polymer film.

13. The method as described in claim 11, wherein the high intensity discharge light comprises a 300 microsecond pulse of visible light having a radiant energy greater than 1 Joule/cm2.

14. The method as described in claim 11, wherein the delineated metallization pattern consists essentially of an electronic circuit pattern.

15. The method as described in claim 11, wherein the high intensity discharge light comprises a broad spectrum of ultraviolet, visible, or infrared radiation.

16. The method as described in claim 11, wherein disposing further comprises pressing the opaque mask directly against the selected regions of the metallization layer.

17. A method for delineating a metallization pattern on substrates, consisting essentially of:

providing a substrate having a metallization layer of sputtered metal selected from the group consisting of aluminum, copper, nickel, titanium, and vanadium, on a major surface thereof;

protecting portions of the metallization layer by means of an opaque positive mask, so as to expose only those portions of the metallization layer intended to be removed;

exposing the protected metallization layer to a burst of high intensity spectral radiation sufficient to cause vaporization and complete removal of the exposed portions of the metallization layer thereby exposing the underlying substrate, wherein the exposed portions of the metallization layer is removed solely by the burst of the high intensity spectral radiation without the use of a chemical substance; and removing the opaque mask to reveal the delineated metallization pattern.

18. The method as described in claim 17, wherein the substrate comprises a flexible polymer film.

19. The method as described in claim 17, wherein the burst of the high intensity spectral radiation comprises a 300 microsecond pulse of visible light having a radiant energy greater than 1 Joule/cm2.

20. The method as described in claim 17, wherein the delineated metallization pattern comprises an electronic circuit pattern.

21. The method as described in claim 17, wherein the high intensity spectral radiation comprises light from a xenon arc lamp source.

22. The method as described in claim 17, wherein the high intensity spectral radiation comprises a broad spectrum of ultraviolet, visible, or infrared radiation.

23. The method as described in claim 17, wherein protecting further comprises pressing the opaque positive mask directly against the portions of the metallization layer.

* * * * *

UNITED STATES PATENT AND TRADEMARK OFFICE
CERTIFICATE OF CORRECTION

PATENT NO. : 8,318,032 B2  
APPLICATION NO. : 11/962164  
DATED : November 27, 2012  
INVENTOR(S) : Szczech et al.

Page 1 of 1

It is certified that error appears in the above-identified patent and that said Letters Patent is hereby corrected as shown below:

In the Specifications:

In Column 3, Line 17, delete "(FIG. IC)" and insert -- (FIG. 1C) --, therefor.

In the Claims:

In Column 5, Lines 25-26, in Claim 13, delete "Joule/cm2." and insert -- Joule/cm$^2$. --, therefor.

In Column 6, Line 24, in Claim 19, delete "Joule/cm2." and insert -- Joule/cm$^2$. --, therefor.

Signed and Sealed this  
Sixteenth Day of April, 2013

Teresa Stanek Rea  
*Acting Director of the United States Patent and Trademark Office*